(12) United States Patent
Yadav et al.

(10) Patent No.: US 8,817,028 B2
(45) Date of Patent: Aug. 26, 2014

(54) CREATING DYNAMIC SETS TO AUTOMATICALLY ARRANGE DIMENSION ANNOTATIONS

(75) Inventors: Sumit Yadav, Acton, MA (US); Vajrang Parvate, Shirley, MA (US); Marc Leizza, Saugus, MA (US); Shailesh Kandage, Westford, MA (US)

(73) Assignee: Dassault Systemes SolidWorks Corporation, Concord, MA (US)

( * ) Notice: Subject to any disclaimer, the term of this patent is extended or adjusted under 35 U.S.C. 154(b) by 1162 days.

(21) Appl. No.: 12/699,661

(22) Filed: Feb. 3, 2010

(65) Prior Publication Data

US 2010/0201684 A1   Aug. 12, 2010

Related U.S. Application Data

(60) Provisional application No. 61/150,701, filed on Feb. 6, 2009.

(51) Int. Cl.
*G06T 13/00* (2011.01)

(52) U.S. Cl.
USPC .......................................... 345/474; 345/419

(58) Field of Classification Search
None
See application file for complete search history.

(56) References Cited

U.S. PATENT DOCUMENTS

| | | | |
|---|---|---|---|
| 4,945,498 A * | 7/1990 | Mitamura | 345/441 |
| 5,929,856 A * | 7/1999 | LoNegro et al. | 715/839 |
| 5,999,186 A | 12/1999 | Jackson | |
| 6,144,381 A * | 11/2000 | Lection et al. | 715/850 |
| 6,215,490 B1 * | 4/2001 | Kaply | 715/788 |
| 6,232,985 B1 * | 5/2001 | Chase et al. | 345/441 |
| 6,583,786 B2 * | 6/2003 | Baumann | 345/419 |
| 6,904,392 B1 * | 6/2005 | Marty et al. | 703/1 |
| 7,039,569 B1 | 5/2006 | Haws et al. | |
| 2002/0018068 A1 | 2/2002 | Baumann | |
| 2005/0278647 A1 * | 12/2005 | Leavitt et al. | 715/765 |
| 2007/0261003 A1 | 11/2007 | Reissmueller | |
| 2010/0031135 A1 * | 2/2010 | Naghshin et al. | 715/230 |
| 2010/0135562 A1 * | 6/2010 | Greenberg et al. | 382/131 |
| 2012/0278762 A1 * | 11/2012 | Mouilleseaux et al. | 715/834 |

FOREIGN PATENT DOCUMENTS

WO   WO 2009/158549   12/2009

OTHER PUBLICATIONS

European Search report of EP 10 15 2836 dated May 5, 2010.

* cited by examiner

*Primary Examiner* — David H Chu
(74) *Attorney, Agent, or Firm* — Hamilton, Brook, Smith & Reynolds, P.C.

(57) ABSTRACT

A computer-implemented method and system creates dynamic sets to automatically arrange dimension annotations in a CAD model. The invention method/product/data storage medium/system determines a location to place a new dimension annotation based on dimension type of the entity selected to annotate. One or more sets of existing dimension annotations are created. The existing dimension annotations in the same set together with the new dimension annotation with similar characteristics as those in the same set are sorted, and then displayed in sorted order in a view of the CAD model on the computer screen.

20 Claims, 15 Drawing Sheets

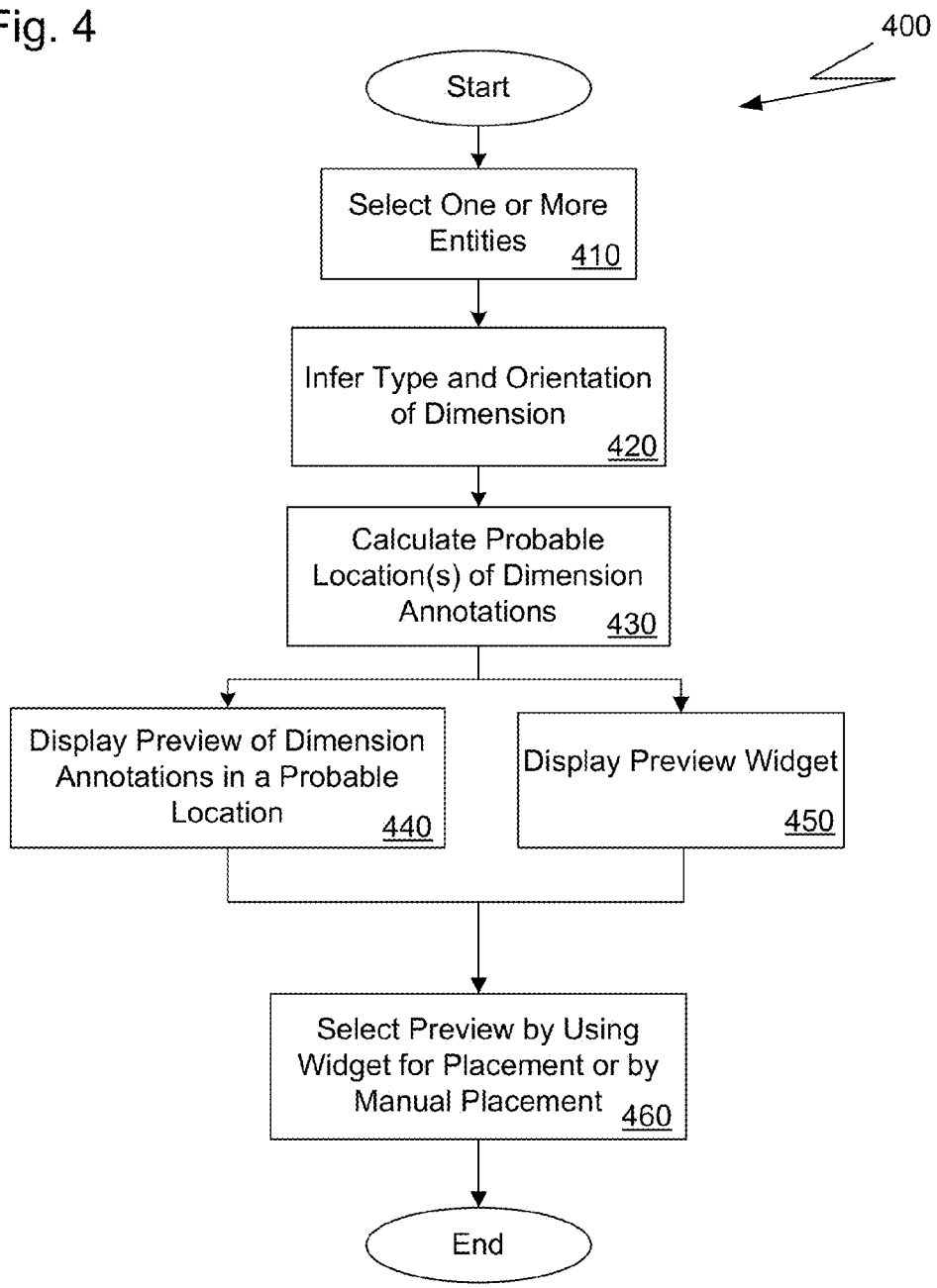

CREATING DYNAMIC SETS TO AUTOMATICALLY ARRANGE DIMENSION ANNOTATIONS

RELATED APPLICATION

This application claims the benefit of U.S. Provisional Application No. 61/150,701, filed on Feb. 6, 2009. The entire teachings of the above application are incorporated herein by reference.

FIELD

This application relates to Computer-Aided Design (CAD), and more particularly, to automatic placement of annotations or dimension indicia.

BACKGROUND OF THE INVENTION

Computer-aided design (CAD) software allows a user to construct and manipulate complex three-dimensional (3D) models. A number of different modeling techniques can be used to create a 3D model. These techniques include solid modeling, wire-frame modeling, and surface modeling. Solid modeling techniques provide for topological 3D models, where the 3D model is a collection of interconnected topological entities (e.g., vertices, edges, and faces). The topological entities have corresponding supporting geometrical entities (e.g., points, trimmed curves, and trimmed surfaces). The trimmed surfaces correspond to the topological faces bounded by the edges. Wire-frame modeling techniques, on the other hand, can be used to represent a model as a collection of simple 3D lines, whereas surface modeling can be used to represent a model as a collection of exterior surfaces. CAD systems may combine these and other modeling techniques, such as parametric modeling techniques. Parametric modeling techniques can be used to define various parameters for different features and components of a model, and to define relationships between those features and components based on relationships between the various parameters.

A design engineer is a typical user of a 3D CAD system. The design engineer designs physical and aesthetic aspects of 3D models, and is skilled in 3D modeling techniques. The design engineer creates parts and may assemble the parts into a subassembly. A subassembly may also consist of other subassemblies. An assembly is designed using parts and subassemblies.

CAD systems may also support two-dimensional (2D) objects, which are 2D representations of 3D objects. Two-dimensional and three-dimensional objects are useful during different stages of a design process. Three-dimensional representations of a model are commonly used to visualize a model in a physical context because the designer can manipulate the model in 3D space and can visualize the model from any conceivable viewpoint. Two-dimensional representations of a model are commonly used to prepare and formally document the design of a model. A 2D representation of the 3D model is referred to as a 2D drawing, or simply, a drawing. A 2D drawing contains one or more drawing views where each view illustrates the model in a specific orientation (e.g., top, front, or left view), or illustrates a detail or section view of the model. In general, the 2D drawing is used to communicate the design to a manufacturing engineer so that the physical object corresponding to the 2D drawing, and therefore, also corresponding to the 3D model, can be built.

Formally documenting a design includes annotating a CAD model using a set of geometric dimensioning formulations thereby enabling a design engineer to communicate the configuration of a part, a subassembly, or an assembly to a manufacturing engineer. The International Standards Organization (ISO) and the American Society of Mechanical Engineers (ASME), among others, establish design and manufacturing standards, which are uniform practices for stating and interpreting dimensioning data.

Annotating a 3D model or a 2D drawing that represents a 3D model in a manner that is clear, concise, and compliant to ASME, ISO, or other dimensioning and tolerancing standards can be an arduous task. Such annotating of 2D drawings may be one of the most tedious and time consuming CAD requirements, which becomes more complicated the more complex the CAD design.

In general, a dimension is a physical aspect or characteristic of an object. Examples of dimensions are height, length, and angle, each which have an orientation and measurement value. Representation or indication of such dimension in CAD drawings is by dimension annotations. A dimension annotation may be formed using dimension lines, text, angle of leader, etc., all of which can be referred to as dimension indicia.

Today, a design engineer may create dimension annotations using a freeform technique. That is, the design engineer can place dimension annotations anywhere within the drawing by moving (e.g., dragging) the dimension indicia (e.g., dimension annotation text or leader line) using a cursor-controlled I/O device, such as a mouse. However, the design engineer should comply with a defined standard. The defined standard governs the offset distances of the dimension lines, on which side of an edge the dimension annotation should be placed, and the angle of a leader (if applicable). Typically in a 2D drawing that complies to a predefined standard, when a dimension is being added to a model, there are predetermined limited logical locations the dimension indicia can be placed. Moreover, design engineers need to select a location where leader lines and text do not overlap. Although sometimes leader lines do need to overlap for lack of space, the text should never overlap. Furthermore, the design engineer often has to manually lineup dimension indicia of one dimension annotation with dimension indicia of other dimension annotations to create a legible and aesthetically pleasing drawing. As more dimensions are added, the area available to place subsequent dimension annotations is reduced, especially since the dimensions already placed are fixed until the design engineer manually changes them.

In U.S. Pat. No. 5,999,186 by Geoff Jackson and assigned to 3-Design LLC of Jackson, Miss., Jackson describes a CAD system with improved means for defining, representing, and modifying dimensions of an object. The user specifies dimension entities that describe components of the entire CAD object. For each dimension entity, the user enters a reference origin having a direction, in addition to normal dimension information. Each dimension entity has a dimension line, a leader line of the dimension line, the text that conveys the value of the dimension line, and coordinate data indicating where the dimension information should be placed. Jackson groups related dimension entities and forms chains of dimension entities based on reference origin. Chained dimension entities and their associated objects are quickly and uniformly modified by a single user command using a parametric dimensioning technique that sequentially recalculates coordinate data of dimension entities in a selected chain (e.g., one having a modified dimension). A drawback of Jackson is the added dimension information that a user is required to input for each drawing entity (e.g., lines, shapes, etc.) of the CAD object.

Some commercially available CAD systems aid in the placement of dimension annotations/indicia. A technique for aiding in the placement of dimension indicia is described by Kurt Phillip Chase, Cummings Jones, and Valerie Taylor in U.S. Pat. No. 6,232,985 assigned to Autodesk, Inc. of San Rafael, Calif. Chase et al describe how the design engineer indicates the position of the dimension line using a mouse or a keyboard, for example. Thus, Chase et al teaches that user intervention is typically employed to locate the dimension indicia (e.g., dimension line).

In U.S. Pat. No. 7,039,569 to Richard Haws and Robert Nicolucci, Haws et al describe a dynamic dimensioning CAD program in which dimension annotations (indicia) are automatically (system) generated and associated with the subject object as the user draws the object. Thereafter, the dimension annotations are adaptive. For example, the system automatically updates the dimension annotations in response to the user changing length of the object and vice versa (i.e., if the user changes the dimension annotation, the system updates the object dimension). The system automatically trims or extends dimension annotations in response to a change in size or position of the associated target object. Positions of dimension annotations for a previous object are automatically shifted to accommodate a newly entered object. Disadvantageously, the user must enter dimension text, dimension lines, and relative positions of objects, as well as specify interposition dimensions or segment lengths in the dimension annotations.

Thus, drawbacks of current state of the art systems include the necessity of moving a cursor (e.g., via a cursor-control I/O device) to a desired location in order to place a dimension annotation or dimension indicia, the need to manually rearrange existing dimension indicia to accommodate a new dimension annotation, and not offering a design engineer choices of logical locations to place a dimension annotation. Additionally, dimensioning a small area of a complex drawing may require alternating between zooming into a drawing view, picking entities, zooming out of the drawing view, and placing the dimension indicia, which is also a tedious process. A system or method that addresses these and other drawbacks would greatly enhance current state-of-the-art computerized systems by allowing dimension annotations to be placed more quickly and in a more efficient manner.

SUMMARY OF THE INVENTION

An example embodiment of the present invention may be implemented in the form of a method or corresponding product, data storage medium, or apparatus for dynamically arranging dimension indicia for a computer-aided design (CAD) model, and include, given a CAD model representing a real-world object:

determining at least one location for placement of a new dimension annotation on a computer screen based on a proximity characteristic, a dimension type of the new dimension, and/or an orientation of the new dimension, wherein the new dimension annotation is instructive of constructing the real-world object, and wherein the determining includes:

creating one or more sets of existing dimension annotations, wherein existing dimension annotations of any one or combination of a proximity range, a same dimension type, and a same orientation belong to a same set; and sorting the existing dimension annotations in the same set and the new dimension annotation having any one or combination of the proximity range, the same dimension type, and the same orientation as the existing dimension annotations in the same set; and rendering the existing dimension annotations in the same set and the new dimension annotation on the computer screen in an arrangement, wherein the rendered arrangement of the existing dimension annotations in the same set and the new dimension annotation corresponds to an order resulting from the sorting.

Furthermore, embodiments may include a user-interface object (e.g., a widget) displayed on the computer screen. The user-interface object comprises a number of divisions, each division designating a respective one of the locations determined for placement of the new dimension annotation. The user-interface object may be displayed with one division in an active state and the rendered arrangement corresponds to the one division that is active.

BRIEF DESCRIPTION OF THE DRAWINGS

The details of one or more embodiments of the invention are set forth in the accompanying drawings and the description that follows. Other features, objects, and advantages of the invention will be apparent from the description and drawings, and from the claims.

FIG. 4 is a flow diagram illustrating a process of one embodiment of the present invention.

Figure 1:
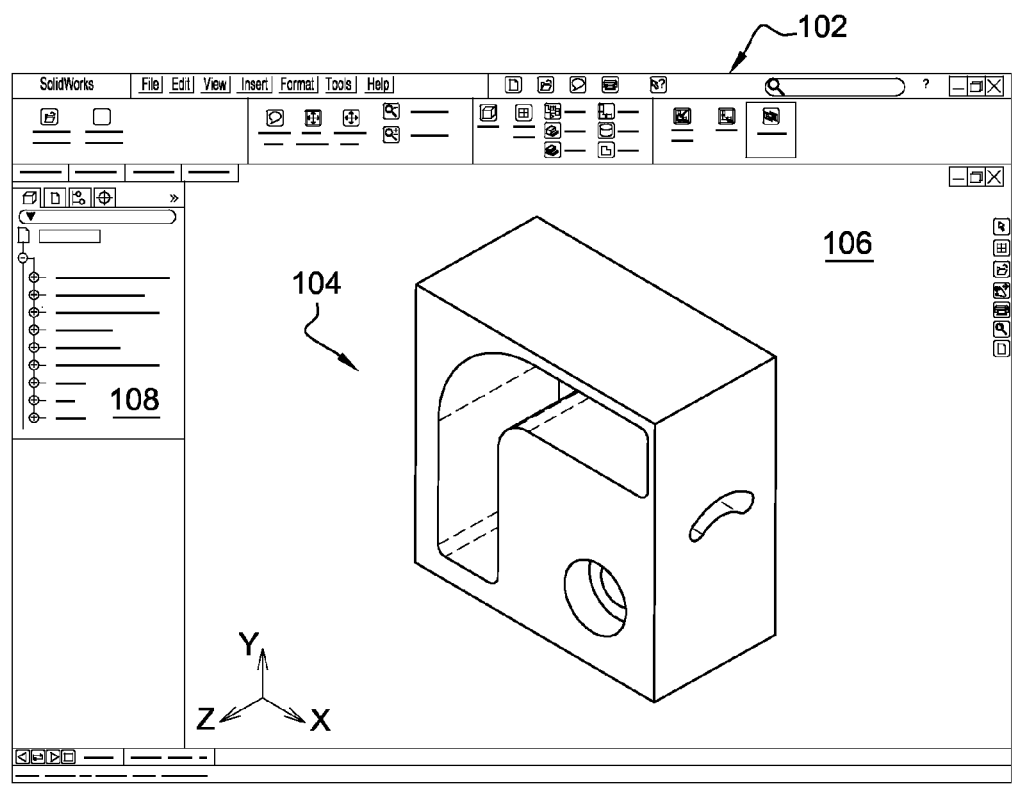
FIG. 1 is an illustration of a computer-generated model and a feature manager portion of a user interface displayed in a window in one embodiment of the present invention.

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

The present invention provides for automatic arrangement of dimension annotations in a 2D CAD drawing. By automatically arranging dimension annotations, the present invention reduces the time required to place dimension annotations in a desired location and reduces the need to manually rectify positions of pre-existing dimension annotations to place a new dimension annotation. The present invention arranges dimension annotations corresponding to linear, angular, radial, and diameter dimensions, and other dimensions with minimum hand movement required to select a location for the dimension annotation.

Referring now to FIG. 1, a window 102 displayed on a computer monitor is shown. The window 102 is generated by modeling software executed by a computerized modeling system, an example of which is later shown with reference to FIG. 7. The window 102 is a conventional computer-generated window that can be programmed by one of ordinary skill in the art using conventional, commercially available, software programming tools, such as those available from Microsoft Corporation of Redmond, Wash.

A computer-generated 3D model 104 is displayed within a modeling portion 106 of the window 102. The surfaces of the 3D model 104 can be displayed, or the 3D model 104 can be displayed using solid lines and dashed lines to show visible edges and hidden edges, respectively, of the 3D model 104. Implementations also may include other window areas, such as a FeatureManager® window panel 108 in which the structure of a part, a subassembly, an assembly, or a drawing is listed to help the user (e.g., a design engineer) visualize and manipulate the 3D model 104, as well as components of the 3D model 104.

Typically, a design engineer uses a mouse (cursor-control) device to select features and parts of a CAD model, as well as to indicate a location for a dimension annotation (or dimension indicia). The location corresponding to the mouse in the modeling portion 106 of the window 102 may be indicated by a pointer (cursor).

Figure 2A:
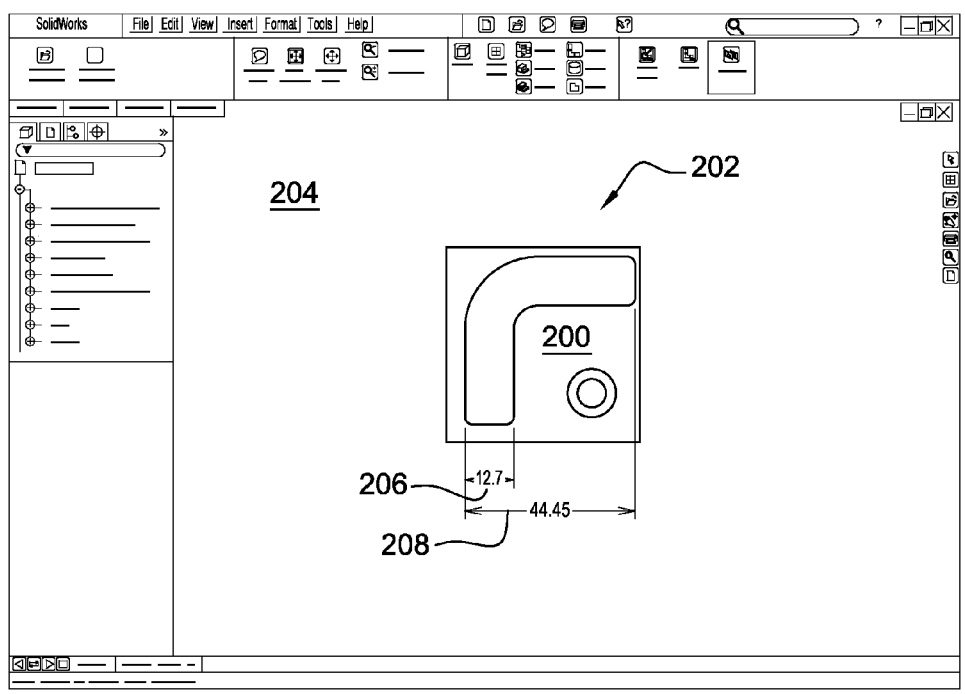
FIGS. 2A-2E are illustrations of a 2D drawing of the computer-generated model in FIG. 1, and a user interface displayed in a window in one embodiment of the present invention.

Referring to FIG. 2A, a drawing view 202 of the 3D model 104 of FIG. 1 is shown in a 2D drawing 204. The drawing view 202 has dimension annotations 206, 208 corresponding to existing horizontal dimensions. When inserting an additional horizontal dimension annotation, the design engineer may decide to locate the additional dimension annotation above or below the object being annotated 200. Locating the additional annotation below the object 200 may require dimension annotation 206 to be shifted upward (depending on the compliance with a uniform practice requiring a specific offset from the annotated entity) and/or dimension annotation 208 to be shifted downward to accommodate the additional horizontal dimension annotation, as shown in FIG. 2B, which illustrates additional horizontal dimension annotation 210 between existing dimension annotations 206, 208.

Figure 2B:
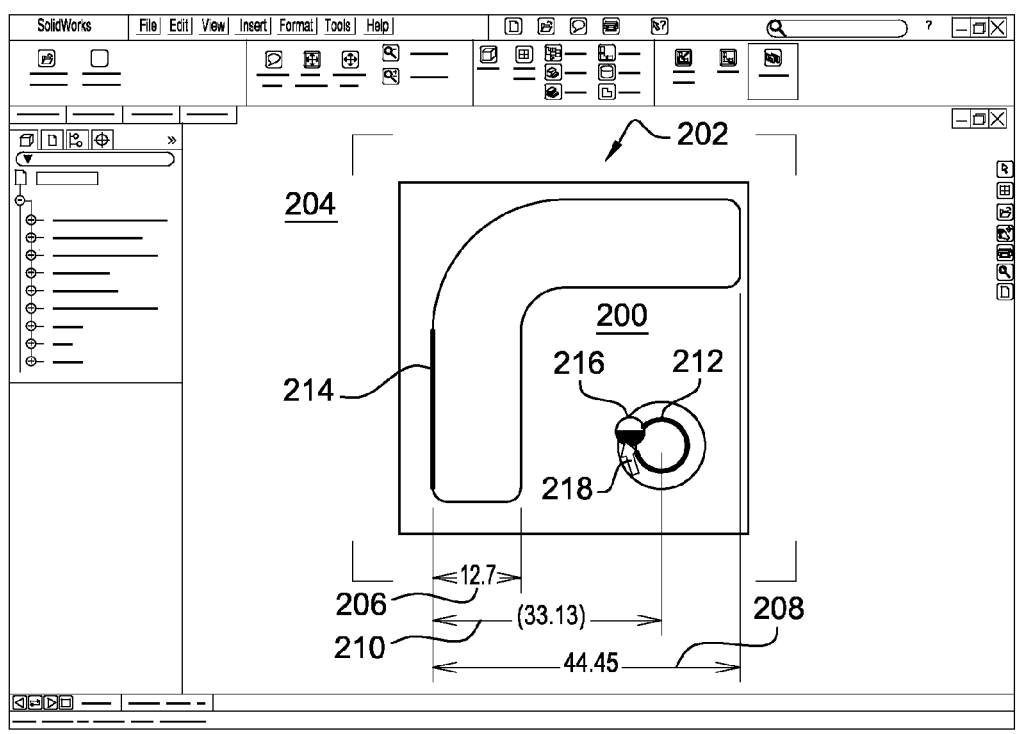
Figure 2C:
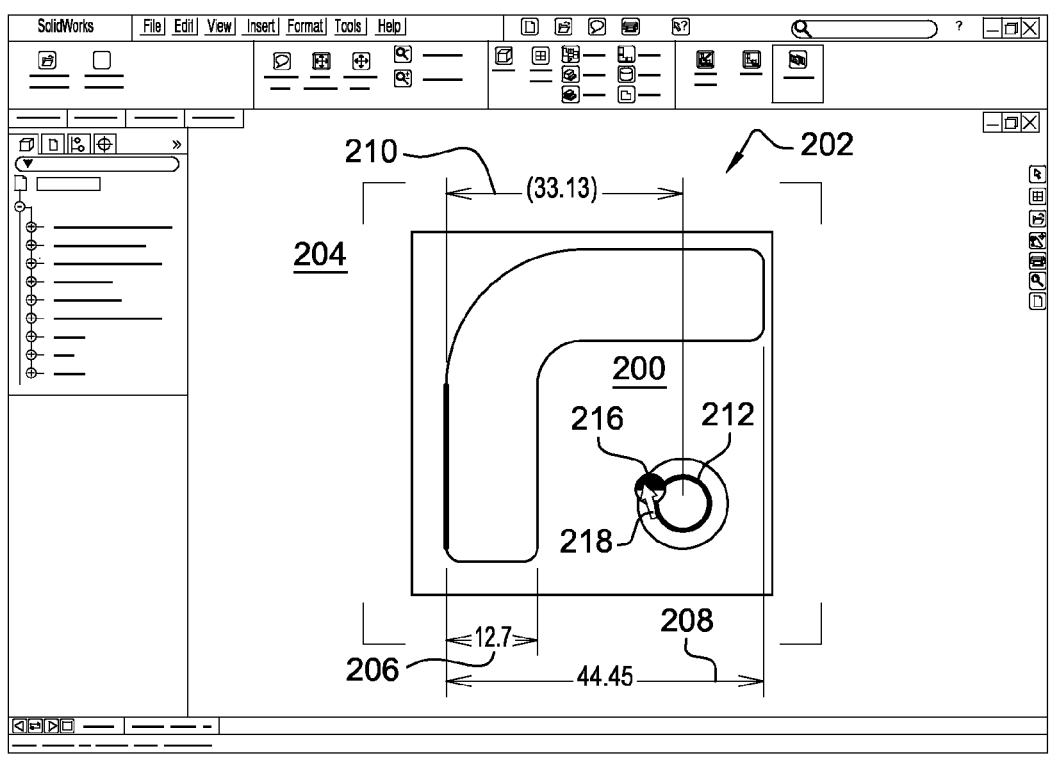

In FIG. 2B, a circle 212 is selected and a preview of the additional horizontal dimension annotation 210 indicating the distance between edge 214 and the center of circle 212 is displayed. A graphical user interface (UI) widget 216 (hereinafter referred to as the preview widget) is displayed behind the cursor 218 to assist the design engineer in placing the additional dimension annotation 210. The preview widget 216 in FIG. 2B-2E is divided into two halves. When the cursor 218 hovers over a lower half of the preview widget 216, a preview of the additional dimension annotation 210 appears below the object being annotated 200, as shown in FIG. 2B; whereas, when the cursor 218 hovers over an upper half of the preview widget 216, a preview of the additional dimension annotation 210 appears above the object being annotated 200, as shown in FIG. 2C. The preview widget 216 relieves the design engineer from excessive hand motion while placing the dimension annotation in the drawing view 202 because clicking a cursor-control I/O device button automatically designates a location above or below the object being annotated 200 in the drawing view 202, where the location corresponds to the highlighted (shown as shaded) half of the preview widget 216 pointed to by cursor 218. The existence and design of the preview widget 216 enables the design engineer to quickly toggle between and select one of two possible locations to place the additional dimension annotation 210 with minimal movement of the cursor 218 and thus minimal movement of the cursor control I/O device and hand of the user.

Figure 2D:
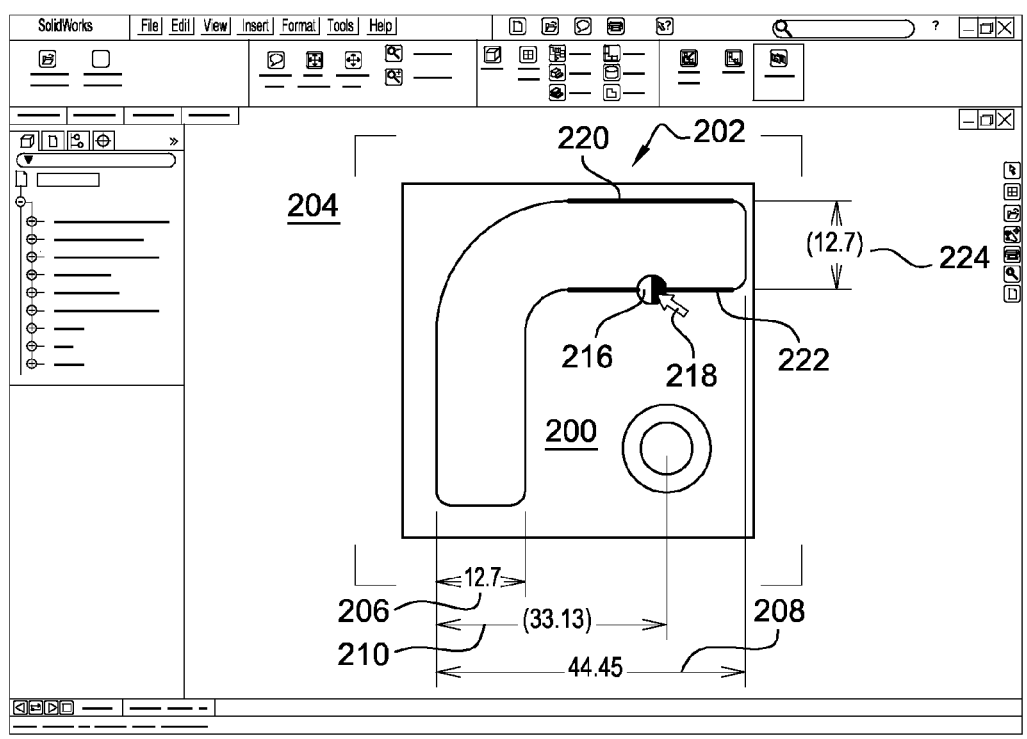
Figure 2E:
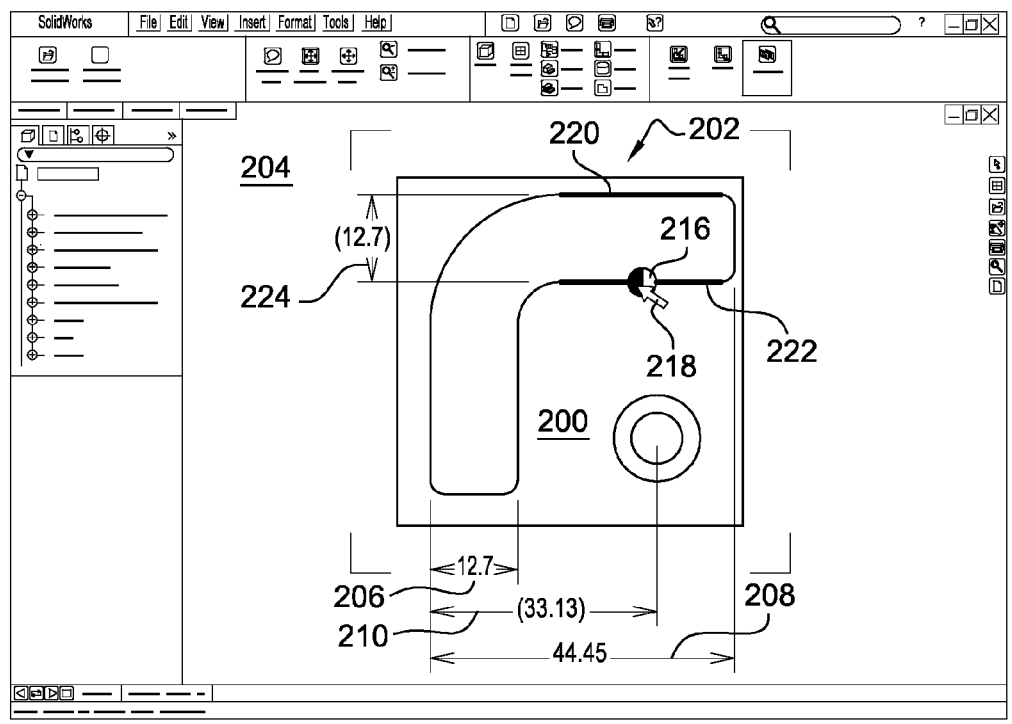

The present invention determines probable locations where the design engineer may want to place a dimension annotation, and the preview widget 216 reflects the probable locations. For example, as shown in FIGS. 2D and 2E, after horizontal edges 220, 222 are selected, the preview widget 216 has a left and a right half because the probable locations to place a vertical dimension annotation 224 corresponding to and annotating the parallel horizontal edges 220, 222 are to the left and right of the object being annotated 200 in the drawing view 202. When the cursor 218 hovers over the right half of the preview widget 216 as illustrated in FIG. 2D, a preview of the vertical dimension annotation 224 appears to the right of the object being annotated 200. When the cursor 218 hovers over the left half of the preview widget 216, the preview of the vertical dimension annotation 224 appears to the left of the object being annotated as illustrated in FIG. 2E.

Illustrated in FIGS. 3A-3D are probable dimension annotation locations of a hole 300 (represented by concentric circles) in the object being annotated 200. In this case, the preview widget 216 has four quadrants and appears beneath (behind) the cursor 218 allowing the design engineer to quickly toggle between and select one of four possible locations to place a diameter dimension annotation 302 with minimal movement of the cursor 218, cursor control I/O device, and user's hand. FIGS. 3A-3D show previews of diameter dimension annotation 302 in the upper right, upper left, lower left, and lower right, respectively. Each preview location in FIGS. 3A-3D corresponds to the quadrant of preview widget 216 to which the cursor 218 is pointing, and which is shaded. The existence and the design of the preview widget 216 has the benefit of alleviating the design engineer from excessive hand motion to place the dimension annotation because the design engineer only needs to move the cursor 218 from one preview widget 216 quadrant to another, then click a mouse button (or similarly indicate using another I/O device) to designate a location to place the diameter dimension annotation 302 in the 2D drawing 204 location.

Figure 3A:
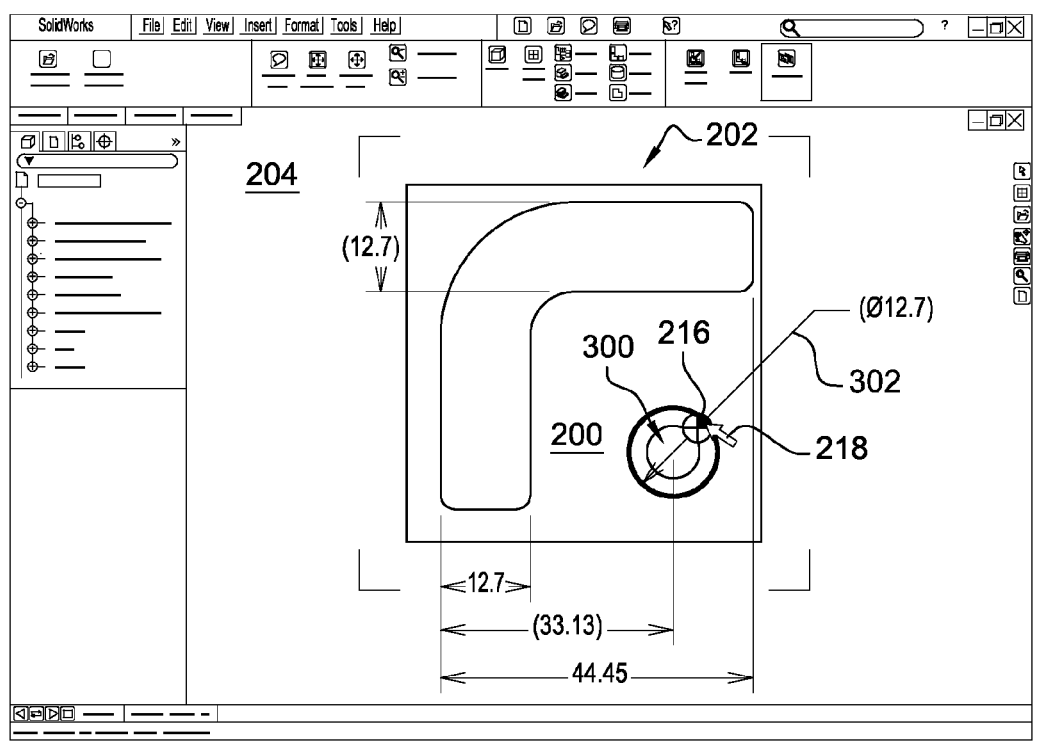
FIG. 3A-3E are illustrations of probable placements of dimension annotations in one embodiment of the present invention.
Figure 3B:
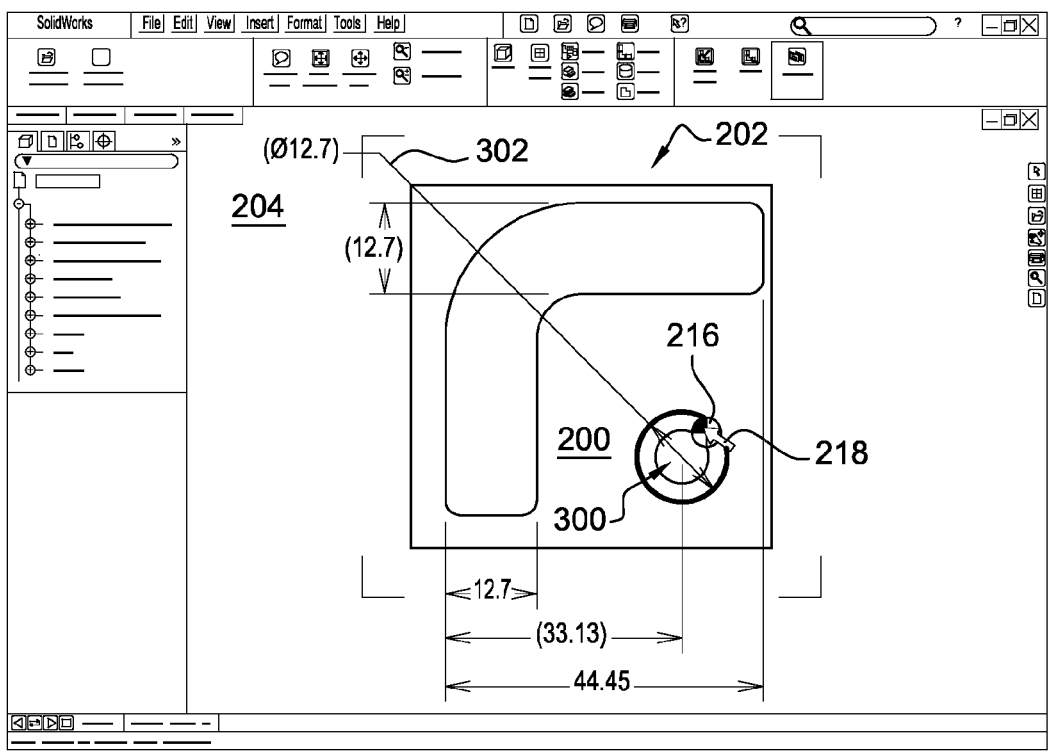
Figure 3C:
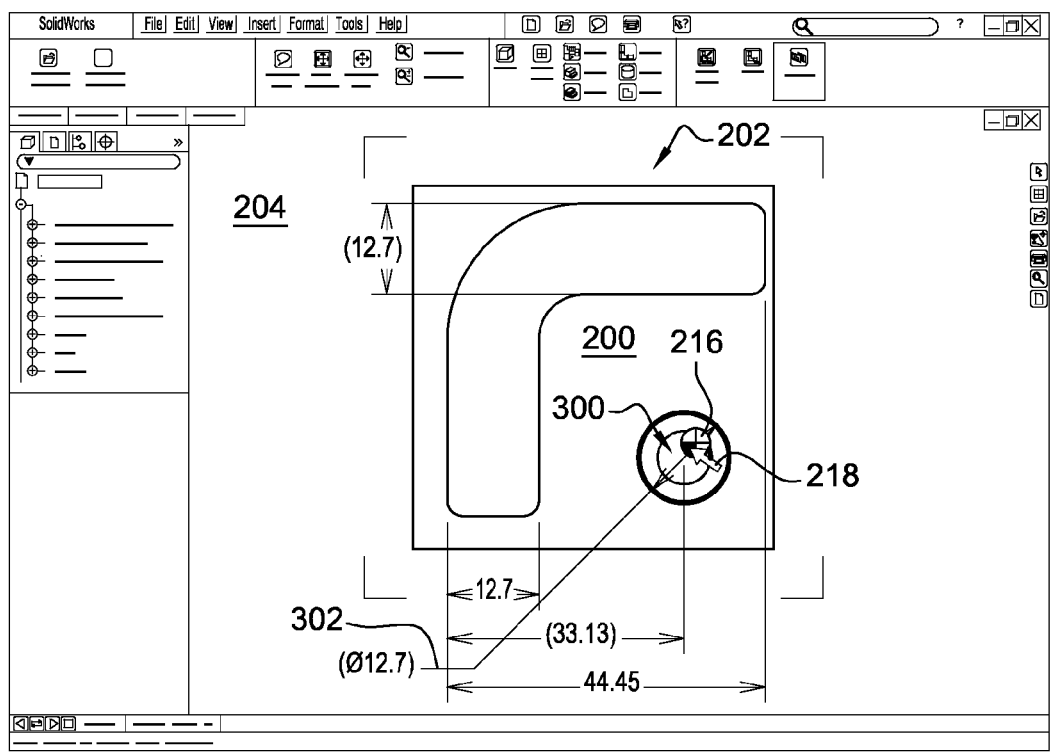
Figure 3D:
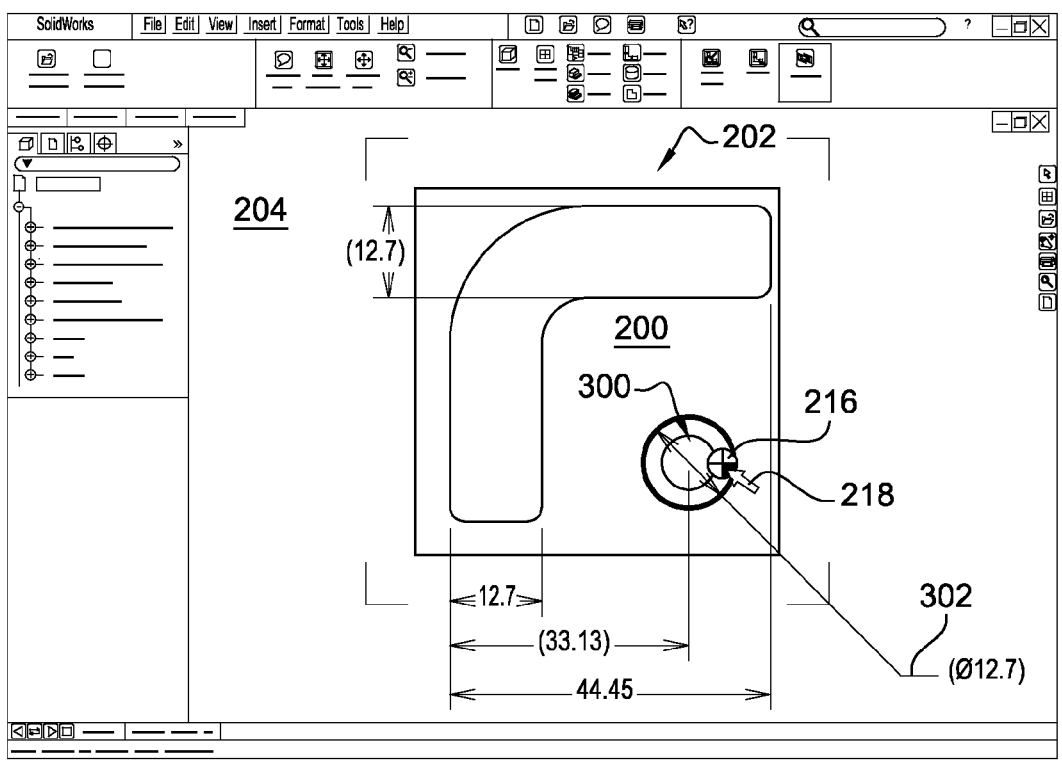
Figure 3E:
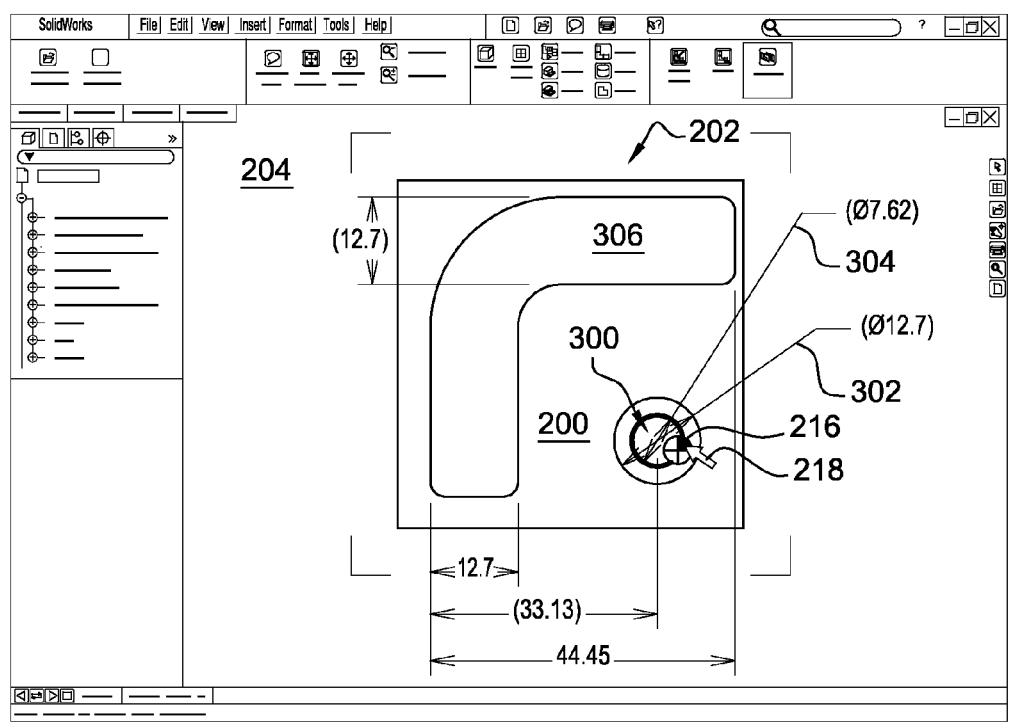

Referring now to FIG. 3E, an additional diameter dimension annotation 304 is shown. The additional diameter dimension annotation 304 has been placed using the same method as described with respect to FIGS. 3A-3D. That is, in FIG. 3E, the upper right quadrant of the preview widget 216 was selected to place the additional diameter dimension annotation 304 in the upper right quadrant of the area relative to and outside the hole 300. The additional diameter dimension annotation 304 is placed in the same quadrant as existing diameter dimension annotation 302. The present invention calculates an offset to place the additional diameter dimension annotation 304 relative to existing diameter dimension annotation 302 (e.g., additional diameter dimensions may be located 15° in the clockwise or counterclockwise direction of existing diameter dimension annotation 302).

When additional dimensions are added, no matter what type, the present invention analyzes the available space for the corresponding new dimension annotation and all existing dimension annotations to determine the placement of all the dimension annotations. For example, a second diameter dimension annotation may be offset 15°. If a third diameter dimension annotation is added to the upper right quadrant outside the hole 300 in FIG. 3E, the number of dimension annotations added to that quadrant are spaced within the quadrant to ensure that the dimension annotations are legible. In one embodiment, each addition radial or diameter dimension annotation may be added at an offset specified as a user-defined or system-defined amount (e.g., 15°) from the existing dimension annotation in the upper right quadrant relative to the hole 300, or the upper right quadrant relative to the hole 300 may be divided into three to determine placement of the three diameter dimension annotations.

To help ensure that the text of a dimension annotation and the dimension lines (including leader and witness lines) do not overlap, a collision detection process is applied. The collision detection process may check for overlapping text and dimension lines (including witness lines, which may also be referred to as extension lines). Although, a dimension line may overlap, the text may not. Rather than shifting text further away from the annotated object, in one embodiment the text is staggered to avoid any overlap. Those skilled in the art understand how to implement collision detection procedures, which are also commercially available. By way of non-limiting example, simple rectangular bounding boxes or complex hulls surrounding the text may be compared to detect collision.

Referring now to FIG. 4, a computer processor module or procedure 400 of one embodiment of the present invention is shown. Procedure 400 automatically arranges dimension annotations/indicia and provides a user-friendly means by which a location for a dimension annotation may be chosen. To begin, one or more drawing entities is selected by the design engineer (step 410). By way of non-limiting example, the entity may be a point, a line, a circle, an arc, or a combination thereof. In the next step, a specific dimension type and orientation is inferred (step 420). For example, after a design engineer picks two non-parallel lines, an angular dimension type may be inferred. A selection of a vertical edge or a selection of two parallel horizontal edges may cause the inference of a vertical linear dimension type; whereas, if a circle is selected, a radial or diameter dimension type having a corresponding dimension annotation oriented in a quadrant outside the circle may be inferred. The SolidWorks® 2009 software product, developed by Dassault Systémes SolidWorks Corporation of Concord, Mass., includes functionality that infers dimension types, including linear, angular, radial, and diameter dimensions types.

Procedure 400 at step 430 next calculates one or more probable locations of the dimension annotation corresponding to the inferred dimension type of step 420. Step 430 is discussed in more detail with reference to FIG. 5. After the probable locations are calculated, procedure 400 displays a preview of the dimension annotation in a probable location (step 440) and displays a preview widget (step 450) to control the display of other calculated probable locations for the dimension annotation. The preview widget indicates which location the probable dimension annotation is displayed by highlighting (e.g., shading) a portion of the widget, by way of non-limiting example. In the final step of procedure 400, a preview is selected in response to a user operation of the preview widget to designate the location of a dimension annotation, or the dimension annotation may be placed manually (step 460).

Figure 5:
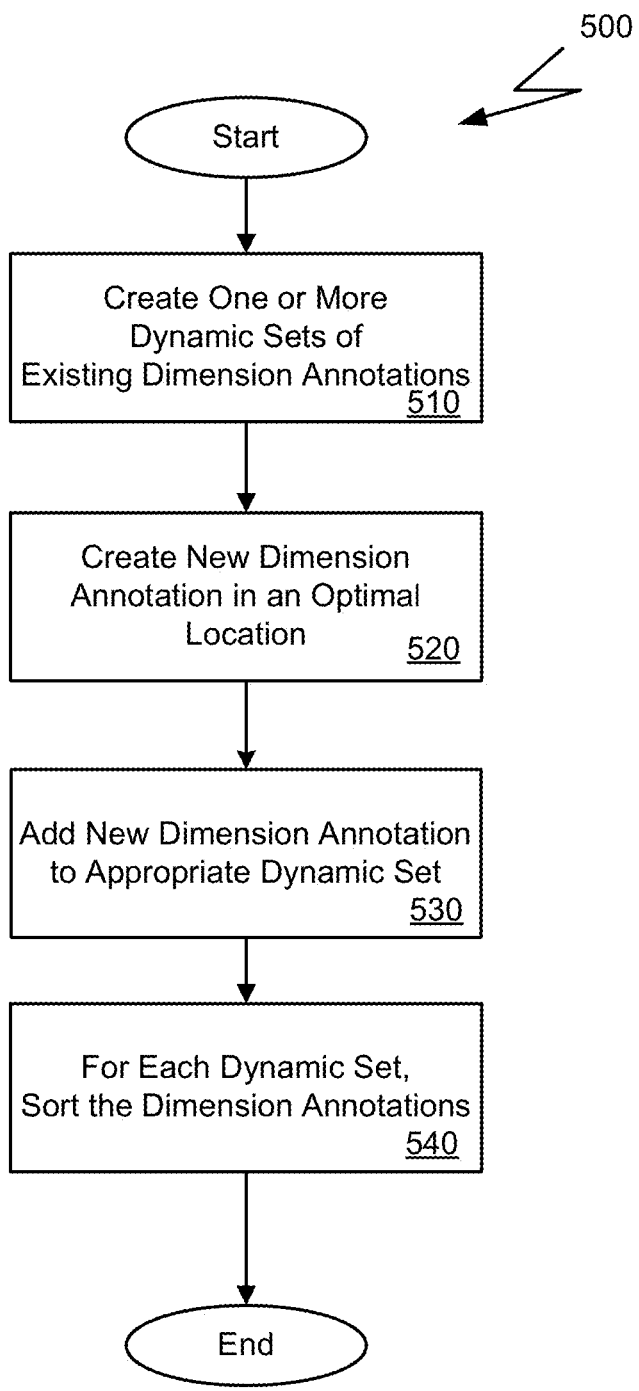
FIG. 5 is a flow diagram illustrating a process of one embodiment of the present invention.

Referring now to FIG. 5, a procedure 500 illustrates steps for calculating the probable locations of dimension annotations (step 430 in FIG. 4). To begin, one or more dynamic sets of existing dimension annotations are created (step 510). In one embodiment, the number of dynamic sets depends on the possible orientation options for the dimension annotation. To create the dynamic sets, all existing dimension annotations are analyzed and those corresponding to the same type of dimension (e.g., linear or radial), having the same orientation (e.g., vertical, horizontal, or within a same quadrant), within a specified proximity of a selected entity (e.g., annotating the same drawing view), with a potential of interfering with the new dimension (e.g., determined by a simple collision detection technique), or a combination thereof, become members of the same dynamic dimension set. The specified proximity may be user-defined or system-defined. Furthermore, the specified proximity may be limited to only the current drawing view (e.g. a front, a left, a top, or a detail view) in the 2D drawing, or the current drawing view and those drawing views bordering the drawing view being annotated.

In embodiments, a dynamic dimension set may also consist of dimension annotations of different types. For example, one dynamic set may consist of all existing vertical dimension annotations to the left of an object being annotated and all existing radial dimension annotations placed in the two left quadrants of the drawing view in which the object being annotated is displayed.

Continuing with FIG. 5, in the next step, a new dimension annotation is created in an optimal location based on the corresponding dimension type and orientation of the selected entity or entities (step 520). By way of non-limiting example, a dimension annotation of a horizontal edge generally has two optimal locations, one above the edge and one below the edge; whereas, a dimension annotation of a circle may have four optimal locations, one in each quadrant and outside the circle. For a dimension between two parallel horizontal lines, optimal dimension annotations may be to the left and to the right of the two parallel horizontal lines. Furthermore, a dimension annotation for an edge at an angle to another entity may have six logical locations.

A most optimal location may be determined as well. For non-limiting example, the selected entity could be compared to the center of a displayed object. Optimal location will then be on the same side of the object as the selected entity, relative to the center.

Empirical techniques may be applied to find optimal locations in addition to the traditionally logical locations. Furthermore, a particular design engineer may have preferred placement preferences, which the present invention may ascertain by analyzing the existing locations of dimension annotations. For example, one embodiment may analyze the position of text in a series of dimension annotations, determine that the text is always staggered, then ensure that a previewed dimension annotation does indeed stagger the dimension text. An embodiment may also determine that annotations are always placed outside drawing view borders or that annotations are within the drawing view borders, and thus, calculate annotation locations according to that practice. Moreover, not only are locations of dimension annotations calculated factoring in the location of the selected entity and other dimension annotations, the entire model shape is also considered when calculating probable locations to ensure that the annotation dimensions do not overlap any model geometry.

Procedure 500 continues at step 530 by adding the new dimension annotation in an optimal location to an appropriate dynamic set, referred to later as the currently active dynamic set. By way of non-limiting example, a new vertical dimension annotation having an optimal location on the left of the object being annotated will become a member of the dynamic set containing all vertical dimension annotations to the left of the object being annotated. In the next step, for each dynamic set (or at least for the currently active and the prior active dynamic sets), all members in the set are sorted based on size and type (step 540). Sorting aids in the placement of the dimension annotations because the order in which the dimension annotations will be arranged in the 2D drawing corresponds to the order in which the respective dimension annotation is stored in the dynamic set. In an embodiment, the dimension annotation of the largest linear dimension will be placed the furthest away from the object being annotated, and therefore the largest linear dimension annotation is ordered last in an ordered set of linear dimension annotations. Furthermore, each dimension annotation when displayed is offset from a consecutively ordered dimension annotation in the same dynamic set by a pre-defined or user-defined amount. After procedure 500 ends, the dimension annotations in at least the currently active dynamic set and possibly a prior active dynamic set are updated. The new dimension annotation appears in the optimal location ordered accordingly with the other dimension annotations in the corresponding dynamic set.

In other embodiments, a procedure similar to procedure 500 is employed to adjust dimension annotations in a drawing or other screen view. Adjustment of dimension annotations includes adding dimension annotations, deleting dimension annotations, or both. When a dimension annotation is deleted, procedure 500 is applied to the remaining dimension annotations and determines candidate locations and arrangements (probable, optimal, etc.) of the remaining dimension annotations for the given drawing or view.

Figure 6:
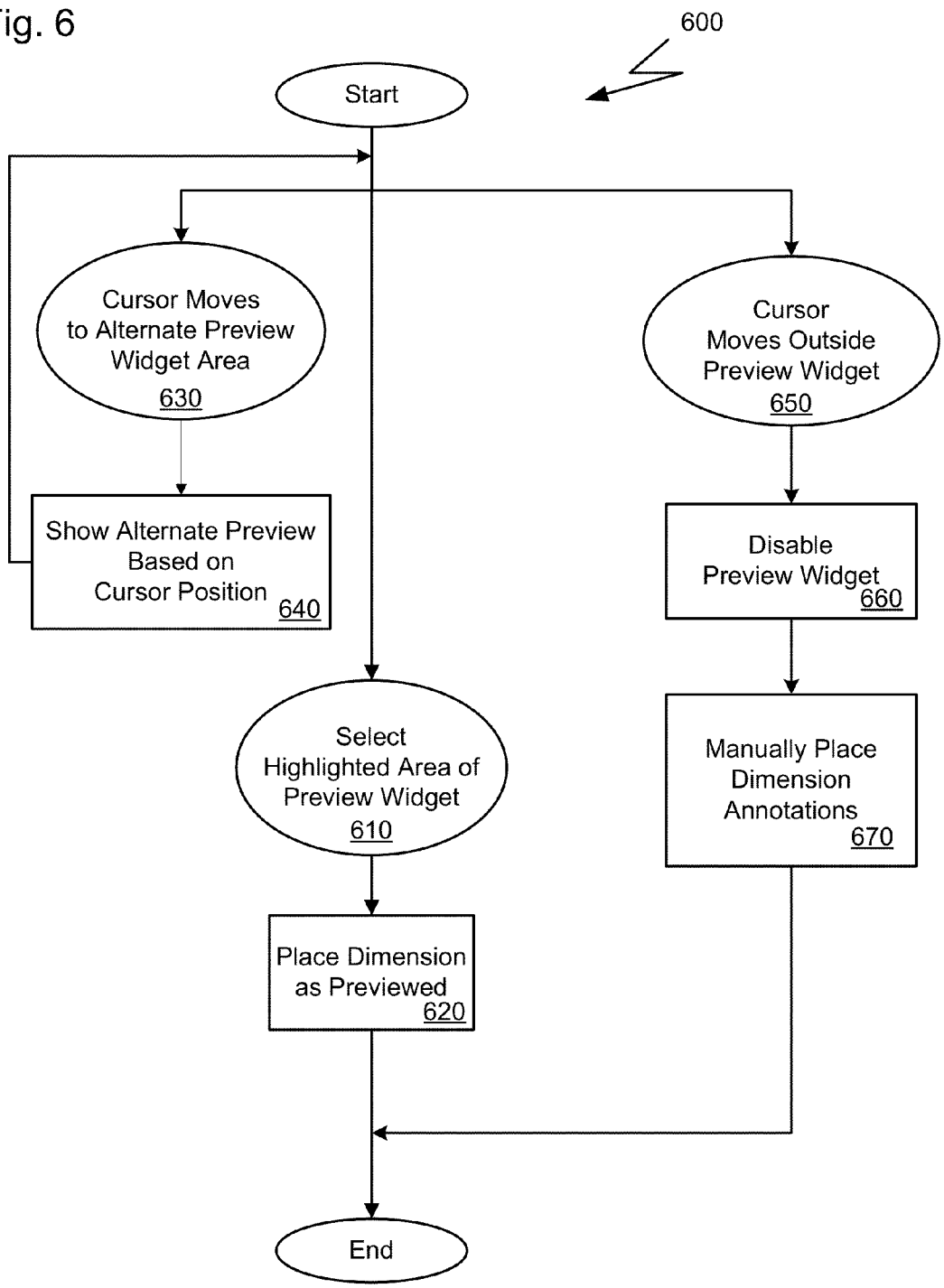
FIG. 6 is a flow diagram illustrating a process of one embodiment of the present invention.

Referring now to FIG. 6, procedure 600 illustrates the user-interactive selection of a location to place the dimension annotation (step 460 in FIG. 4). When procedure 600 begins, a preview of a probable placement position calculated by procedure 500 and a preview widget 216 are shown (steps 440, 450 in FIG. 4). In one embodiment, a portion of the preview widget 216 is highlighted to visually indicate the location of the previewed dimension annotation (as shown in FIGS. 2B-2E and 3A-3E). Other visual cues are suitable.

If the highlighted region of the preview widget 216 is selected (step 610) by the user, procedure 600 places the new dimension annotation in the preview location (step 620). Alternatively, procedure 600 tracks the cursor 218 movement to another portion of the preview widget 216 (step 630) and responsively displays an alternate dimension annotation preview (step 640). The highlighted area of the preview widget 216 may then be user selected (step 610) to place the new dimension annotation in the preview location (step 620), or the cursor 218 on user command/control may move to another area of the preview widget 216 (step 630) for display of another alternate dimension annotation preview (step 640), and so on. To show an alternate preview based on the cursor 218 location (step 640), a probable location of the dimension annotation is calculated, as described with reference to procedure 500.

The design engineer may also explicitly place the dimension annotation wherever desired by simply moving the cursor 218 outside of the preview widget boundary (step 650). In one embodiment, moving the cursor 218 outside the preview widget boundary temporarily disables the preview widget 216 (step 660), thereby allowing the design engineer to manually place the dimension annotation (step 670) in the drawing or screen view. Furthermore, in an embodiment, the design engineer can re-enable the preview widget 216 by moving the cursor 218 back over the disabled preview widget (not shown in FIG. 6).

In other embodiments, the different computer-generated screen views include three-dimensional representations of a subject object, two-dimensional representations of a subject object and the like. The invention CAD system and method determines one or more candidate locations in the screen view for providing dimension annotations. Each candidate location is user-selectable. In addition for ease of use, the invention provides a user interface tool or widget that enables efficient (e.g., one click or cursor hover) user preview of the different candidate locations and ultimately user selection of one of the candidate locations. Efficiency and ease in user movements to operate the widget to produce the previews of different candidate locations include hovering the cursor over different portions of the widget that correspond respectively to the different candidate locations. The different portions of the widget are visually indicated (or graphically defined) by geometry, shading, coloring and the like. Preferably, for each widget portion, location of the portion relative to the whole widget (e.g., upper portion, lower portion, rightmost, leftmost) is indicative of respective corresponding candidate location in the screen view (above the object representation, below the object representation, to the right of, to the left of, respectively). User selection of a preview is thus easily achieved by the user hovering the cursor near the portion of the widget corresponding to the candidate location desired for view. User selection of a candidate location (and dimension annotation) is similarly an easy user operation (point the cursor to the corresponding widget portion and click on/operate the I/O device to select).

In this way, the present invention widget/user interface and system provides increased user-movement efficiency (e.g., low number of steps, quicker operation process, etc.) in generating dimension annotations, previewing different candidate locations of dimension annotations, and selecting a desired one of the candidate locations/dimension annotations.

In one embodiment, a data structure for a dimension annotation is created once and one or more parameters are modified in the data structure to create alternative previews. For example, a dimension data structure may have parameters that specify a dimension annotation location, a dimension type (e.g., linear or radial), and an orientation (e.g., vertical or horizontal). An embodiment may also pre-define an angle of a leader for a radial or a diameter dimension annotation. For example, the leader line angle may be 45°, 135°, 225°, or 315°. To show alternative previews, only the parameter that specifies location coordinates may need to be modified according to the result of the sorting step 540 in FIG. 5 and an offset amount. In some cases, a parameter specifying orientation may also need to be modified, by way of non-limiting example, from vertical to horizontal.

Figure 7:
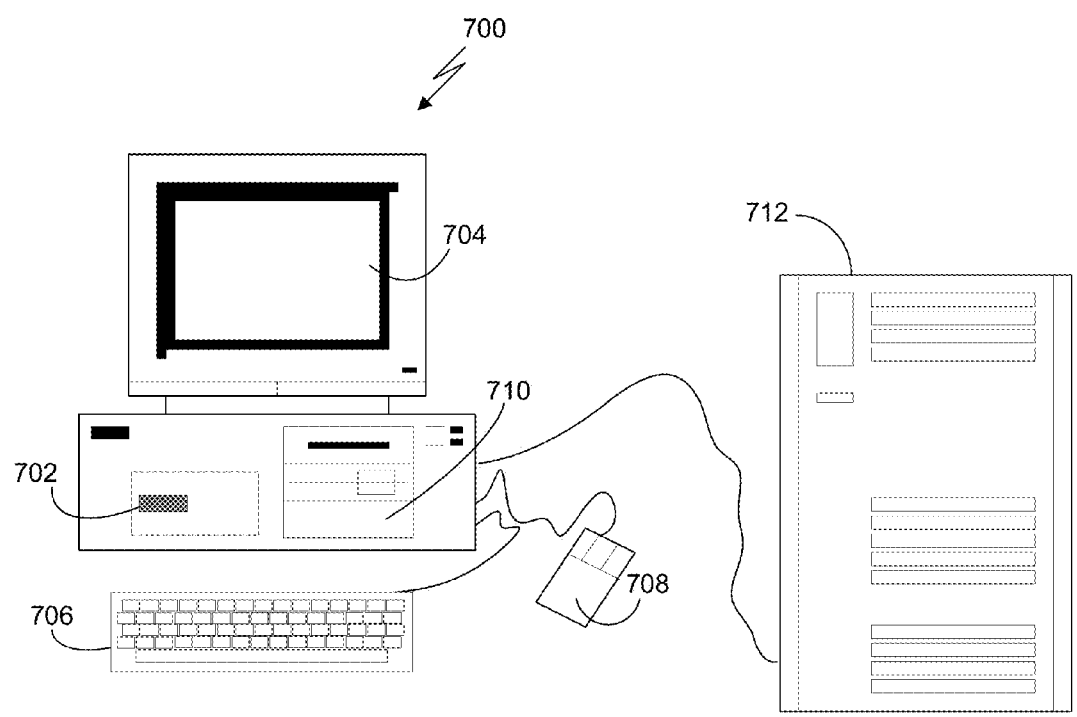
FIG. 7 is a schematic diagram of a computer system in which embodiments of the present invention are implemented.

Referring now to FIG. 7, a computerized modeling system 700 is shown and includes a CPU 702, a computer monitor 704, a keyboard input device 706, a mouse input device 708, and a storage device 710. The CPU 702, computer monitor 704, keyboard 706, mouse 708, and storage device 710 can include commonly available computer hardware devices. For example, the CPU 702 can include a Pentium-based processor. The mouse 708 may have conventional left and right buttons that the user may press to issue a command to a software program being executed by the CPU 702. As an alternative or in addition to the mouse 708, the computerized modeling system 700 can include a pointing device such as a trackball, touch-sensitive pad, or pointing device and buttons built into the keyboard 706. Those of ordinary skill in the art appreciate that the same results described herein with reference to a mouse device can be achieved using another available pointing device. Other appropriate computer hardware platforms are suitable as will become apparent from the discussion that follows. Such computer hardware platforms are preferably capable of operating the Microsoft® Windows® 2000, Windows XP, Windows Vista®, Windows 7, UNIX®, Linux, or Mac OS® operating systems.

Additional computer processing units and hardware devices (e.g., graphic accelerator processors, rapid prototyping, video, and printer devices) may be included in the computerized modeling system 700. Furthermore, the computerized modeling system 700 may include network hardware and software thereby enabling wired or wireless communication to a hardware platform 712, and facilitating communication between numerous computer systems that may include a CPU and a storage system, among other computer components.

Computer-aided drafting and modeling software may be stored on the storage device 710 and loaded into and executed by the CPU 702. The drafting and modeling software allows a user to create and modify a 2D drawing and a 3D model, and implements aspects of the invention described herein. The CPU 702 uses the computer monitor 704 to display a 3D model and other aspects thereof as described. Using the keyboard 706 and the mouse 708, the user can enter and modify data associated with the 2D drawing and/or 3D model. The CPU 702 accepts and processes input from the keyboard 706 and mouse 708. The CPU 702 processes the input along with the data associated with the 2D drawing and/or 3D model and makes corresponding and appropriate changes to that which is displayed on the computer monitor 704 as commanded by the drafting or modeling software. In one embodiment, the software is based on a solid modeling system that may be used to construct a 3D model consisting of one or more solid and surface bodies.

The invention may be implemented in digital electronic circuitry, or in computer hardware, firmware, software, or in combinations thereof. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The invention may advantageously be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; in any case, the language may be a compiled or interpreted language. Suitable processors include, by way of non-limiting example, both general and special purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, custom-designed ASICs (application-specific integrated circuits).

Dynamically arranging dimension lines in the manner described herein realizes time-saving advantages afforded by presenting to the design engineer one or more probable locations of a new dimension annotation and enabling the design engineer to quickly select a location for the new dimension annotation (with minimal hand motion). Moreover, existing dimension annotations may also be automatically re-arranged in real time to accommodate the new dimension annotation by shifting locations as a new dimension annotation is previewed in one or more locations, by way of non-limiting example. Using the present invention, a design engineer can interact more rapidly while annotating a complex model, and thereby increase his productivity. Other advantages include being able to remain zoomed into a portion of a complex drawing to annotate small entities without having to go back and forth between zooming in and out of the drawing to accomplish the task.

A number of embodiments of the present invention have been described. Nevertheless, it will be understood that various modifications may be made without departing from the spirit and scope of the invention. For example, implementations may change the order in which operations are performed. Furthermore, depending on the needs of an implementation, particular operations described herein may be implemented as a combined operation, eliminated, added to, or otherwise rearranged. By way of non-limiting example, one embodiment may eliminate step 530 in FIG. 5 because the present invention does not necessitate that the new dimension annotation be added to a dynamic set for the new dimension annotation to be sorted with the members of the dynamic set.

While this invention has been particularly shown and described with references to example embodiments thereof, it will be understood by those skilled in the art that various changes in form and details may be made therein without departing from the scope of the invention encompassed by the appended claims. For example, those skilled in the art will know how to implement the systems and methods described herein to annotate 3D models, add other annotations such as tolerances, rearrange annotations after an annotation is deleted, and provide multiple location options for an annotation relative to one specific dynamic set (e.g., more than one probable location with a quadrant for a diameter dimension annotation).

What is claimed is:

1. A computer-implemented method for automatically placing a new dimension annotation of a computer-aided design model representing a real-world object, the method comprising:

having a computer-aided design model displayed on a computer screen, the displayed computer-aided design model including various entities;

in a processor, receiving user selection of an entity to annotate in the displayed computer-aided design model, said user selection being by a user placing a cursor at the entity as displayed in the computer-aided design model on the computer screen;

in response, in the processor, automatically determining at least one location in association with the selected entity in the displayed computer-aided design model for placement of the new dimension annotation based on dimension type of the selected entity, wherein the new dimension annotation is an additional dimension annotation relative to currently existing dimension annotations in the computer-aided design model, and the new dimension annotation is instructive of constructing the real-world object, and wherein the determining includes:

creating one or more sets of the currently existing dimension annotations, wherein currently existing dimension annotations of any one or combination of a similar proximity range, a same dimension type, and a same orientation belong to a same set; and sorting the currently existing dimension annotations in the same set and the new dimension annotation having any one or combination of the similar proximity range, the same dimension type, and the same orientation as the currently existing dimension annotations in the same set;

rendering the currently existing dimension annotations in the same set and the new dimension annotation on the computer screen in an arrangement, wherein the rendered arrangement of the currently existing dimension annotations in the same set and the new dimension annotation corresponds to an order resulting from the sorting; and displaying a user-interface widget near placement of the cursor as placed at the selected entity, the user-interface widget designating the locations determined for placement of the new dimension annotation, and upon the cursor hovering over the widget, displaying a preview of the rendered arrangement having the new dimension annotation placed in one of the determined locations in the displayed computer-aided design model.

2. The computer-implemented method of claim 1, wherein the user-interface widget comprises a number of divisions, each division designating a respective one of the locations determined for placement of the new dimension annotation, and for the cursor hovering over a given division of the widget, displaying a preview of the rendered arrangement having the new dimension annotation placed in the respective determined location designated by the given division.

3. The computer-implemented method of claim 2, wherein the widget is displayed with one division in an active state, and the rendered arrangement corresponds to the one division that is active.

4. The computer-implemented method of claim 1 where the step of sorting is based on at least a size of the entity being dimensioned.

5. The computer implemented method of claim 4 wherein the sorting based on size results in a dimension annotation having a largest linear dimension being last in the order in the same set; and
the rendered arrangement places the largest linear dimension annotation furthest away from the computer-aided design model on the computer screen.

6. The computer-implemented method of claim 1 wherein the step of determining includes determining optimal location for placement of the new dimension annotation.

7. The computer-implemented method of claim 1 wherein the step of determining at least one location for placement of the new dimension annotation employs collision detection.

8. The computer-implemented method of claim 1 wherein the step of determining includes staggering respective text of dimension annotations to avoid overlap.

9. A non-transitory computer readable medium embodying a computer program product, and executed by a computer for automatic placement of dimension annotations of a CAD model, comprising:
a computer-readable data storage medium having instructions embedded thereon and configured to cause a computer to:
operate on a CAD model displayed on a computer screen, the displayed CAD model including one or more entities;
receive user selection of an entity to annotate in the displayed CAD model, said user selection being by a user placing a cursor at the entity as displayed in the CAD model on the computer screen;
automatically determine at least one location in association with the selected entity in the displayed CAD model for placement of a new dimension annotation on the computer screen based on a dimension type of the selected entity, wherein the new dimension annotation is an additional dimension annotation with respect to currently existing dimension annotations in the CAD model, and the new dimension annotation is instructive of construction of a real-world object, and wherein the determining being by:
creating one or more sets of the currently existing dimension annotations, wherein currently existing dimension annotations of any one or combination of a similar proximity characteristic, a same dimension type, and a same orientation belong to a same set; and
sorting the currently existing dimension annotations in the same set and the new dimension annotation having any one or combination of the similar proximity characteristic, the same dimension type, and the same orientation as the currently existing dimension annotations in the same set;
display an arrangement of the currently existing dimension annotations in the same set and the new dimension annotation on the computer screen, wherein the displayed arrangement of the currently existing dimension annotations in the same set and the new dimension annotation corresponds to an order resulting from the sorting; and
display a user interface widget near placement of the cursor as placed at the selected entity, the user interface widget designating the locations determined for placement of the new dimension annotation, and upon the cursor hovering over the widget, displaying a preview of the displayed arrangement having the new dimension annotation placed in one of the determined locations in the displayed CAD model.

10. A non-transitory computer-readable data storage medium comprising:
non-volatile memory storing instructions for operatively instructing a digital processor to automatically adjust an arrangement of currently existing dimension annotations of a computer-aided design model representing a real-world object, the computer-aided design model being displayed on a computer screen and having one or more entities, the memory programmably causing said digital processor to:
receive from a user input device input to adjust the arrangement, wherein the input specifies one of adding a certain dimension annotation to the arrangement and deleting one of the currently existing dimension annotations from the arrangement, and the input specifies user selection of an entity to annotate, said user selection being by user placement of a cursor at the entity as displayed in the computer-aided design model;
create one or more sets of the currently existing dimension annotations, wherein currently existing dimension annotations of any one or combination of a similar proximity, a same dimension type, and a same orientation belong to a same set;
sort the currently existing dimension annotations in the same set resulting in one or more probable locations able to be associated with the selected entity in the displayed computer-aided design model for placement of dimension annotations in the arrangement when adjusted either without the deleted one of the currently existing dimension annotations or with the certain dimension annotation added, and if the input specifies adding the certain dimension annotation to the arrangement and the certain dimension annotation has any one or combination of the similar proximity, the same dimension type, and the same orientation as the currently existing dimension annotations in the same set, then sort the certain dimension annotation along with the currently existing dimension annotations in the same set;

automatically adjust the arrangement of the dimension annotations and render the adjusted arrangement on the computer screen by employing an ordering resulting from the sorting, wherein:

the ordering including the certain dimension annotation in the adjusted arrangement if the input specifies adding the certain dimension annotation, wherein a location of the certain dimension annotation in the adjusted arrangement corresponds to the ordering resulting from the sort; and the ordering excluding the one of the currently existing dimension annotations from the adjusted arrangement if the input specifies deleting said one of the currently existing dimension annotations from the arrangement; and display a user-interface widget near the user placement of the cursor at the selected entity, the user-interface widget designating the probable locations for placement of the dimension annotations in the adjusted arrangement of the dimension annotations, and upon a user hovering the cursor over the widget, display a preview of the adjusted arrangement.

11. The non-transitory data storage medium as claimed in claim 10 wherein the user-interface widget comprises a number of divisions, each division designating a respective one of the probable locations for placement of dimension annotations in the adjusted arrangement.

12. The non-transitory data storage medium as claimed in claim 11 wherein the widget is displayed with one division in an active state, and the rendered adjusted arrangement corresponds to the one division that is active.

13. The non-transitory data storage medium as claimed in claim 10 where the step of sorting is based on at a least size of the entity being dimensioned.

14. The non-transitory data storage medium as claimed in claim 10 wherein the input specifies adding the certain dimension annotation, and the steps of creating and sorting include determining optimal location for placement of the certain dimension annotation.

15. The non-transitory data storage medium as claimed in claim 10 further comprising instructions to stagger respective text of dimension annotations in the adjusted arrangement.

16. A computer apparatus for automatically adjusting an arrangement of dimension annotations of a CAD model, comprising:

a computer module receiving input to adjust the arrangement, wherein the input specifies one of adding a certain dimension annotation to the arrangement and deleting one dimension annotation from the arrangement, wherein the dimension annotations of said arrangement are pre-existing dimension annotations of the CAD model relative to the certain dimension annotation, and wherein the CAD model is displayed on a computer screen and has one or more entities, the input specifying user selection of an entity to annotate, user selection being by user placement of a cursor at the entity as displayed in the CAD model; and in response to the input, the computer module:

creates one or more sets of the pre-existing dimension annotations, wherein pre-existing dimension annotations of any one or combination of a similar proximity range to the CAD model, a same dimension type, and a same orientation belong to a same set;

sorts the pre-existing dimension annotations in the same set resulting in one or more probable locations associated with the selected entity in the displayed CAD model for placement of dimension annotations in the arrangement when adjusted either without the one dimension annotation or with the certain dimension annotation added, and if the input specifies adding the certain dimension annotation to the arrangement and the certain dimension annotation has any one or combination of the similar proximity range, the same dimension type, and the same orientation as the pre-existing dimension annotations in the same set, then sorting the certain dimension annotation along with the pre-existing dimension annotations in the same set;

automatically adjusts the arrangement of the dimension annotations and rendering the adjusted arrangement on the computer screen by employing an ordering resulting from the sorting, wherein:

the ordering including the certain dimension annotation in the adjusted arrangement if the input specifies adding the certain dimension annotation, wherein a location of the certain dimension annotation in the adjusted arrangement corresponds to the ordering resulting from the sorting; and the ordering excluding the one dimension annotation from the adjusted arrangement if the input specifies deleting the one dimension annotation from the arrangement; and displays in a user interface a widget near the user placement of the cursor at the selected entity, and the widget designating the probable locations for placement of the dimension annotations in the adjusted arrangement of the dimension annotations, and upon a user hovering the cursor over the widget, displays a preview of the adjusted arrangement.

17. The computer apparatus as claimed in claim 16 wherein the widget is formed of a number of divisions, each division representing a respective one of the probable locations for placement of the dimension annotations, the widget enabling user selection of the adjusted arrangement; and through the different divisions, the widget further enables previewing of different ones of the probable locations for placement of the dimension annotations.

18. The computer apparatus as claimed in claim 17 wherein the widget is displayed with one division in an active state, and the rendered adjusted arrangement corresponds to the one division that is active.

19. The computer apparatus as claimed in claim 16 wherein the computer module sorting is based on dimension size.

20. The computer apparatus as claimed in claim 16 wherein the computer module further staggers respective text of dimension annotations in the adjusted arrangement.

* * * * *